United States Patent [19]

Hashimoto et al.

[11] Patent Number: 4,727,310

[45] Date of Patent: Feb. 23, 1988

[54] DIGITAL VOLT-OHM METER WITH AUDIBLE SYNTHESIS OF MEASURED VALUES

[75] Inventors: Shintaro Hashimoto, Ikoma; Sigeaki Masuzawa; Hiroshi Miyazaki, both of Nara; Yutaka Ikemoto, Nara; Susumu Maetani, Fukuoka; Akira Tanimoto, Kashihara, all of Japan

[73] Assignee: Sharp Kabushiki Kaisha, Osaka, Japan

[21] Appl. No.: 405,275

[22] Filed: Aug. 4, 1982

Related U.S. Application Data

[63] Continuation of Ser. No. 130,349, Mar. 14, 1980, abandoned.

[30] Foreign Application Priority Data

| Mar. 16, 1979 | [JP] | Japan | 54-32154 |
| Mar. 16, 1979 | [JP] | Japan | 54-32153 |
| Mar. 16, 1979 | [JP] | Japan | 54-32152 |
| Mar. 20, 1979 | [JP] | Japan | 54-36538[U] |
| Mar. 22, 1979 | [JP] | Japan | 54-37760[U] |
| Mar. 22, 1979 | [JP] | Japan | 54-37759[U] |
| Mar. 22, 1979 | [JP] | Japan | 54-37758[U] |
| Mar. 22, 1979 | [JP] | Japan | 54-37757[U] |
| Mar. 22, 1979 | [JP] | Japan | 54-33905 |

[51] Int. Cl.$^4$ .................. G01R 19/00; G06F 3/16
[52] U.S. Cl. .................. 324/157; 324/99 D; 364/710
[58] Field of Search .................. 324/157, 99 D; 179/15 M; 364/710

[56] References Cited

U.S. PATENT DOCUMENTS

| 3,081,431 | 3/1963 | Werner et al. | 324/99 D |
| 3,163,819 | 12/1964 | Calhoun | 324/99 D |
| 3,828,252 | 8/1974 | Wolff | 324/157 |
| 4,185,169 | 1/1980 | Tanimoto | 364/710 |

Primary Examiner—Reinhard J. Eisenzopf
Assistant Examiner—W. Snow
Attorney, Agent, or Firm—Birch, Stewart, Kolasch & Birch

[57] ABSTRACT

A measuring instrument capable of providing its readouts of measurements of a physical quantity such as voltage, current or resistance includes voice synthesizer circuitry which may be realized by the use of a large scale integrated circuit (LSI) chip. A mode selector switch is provided for selection of an audible indication mode and a visual indication mode.

8 Claims, 7 Drawing Figures

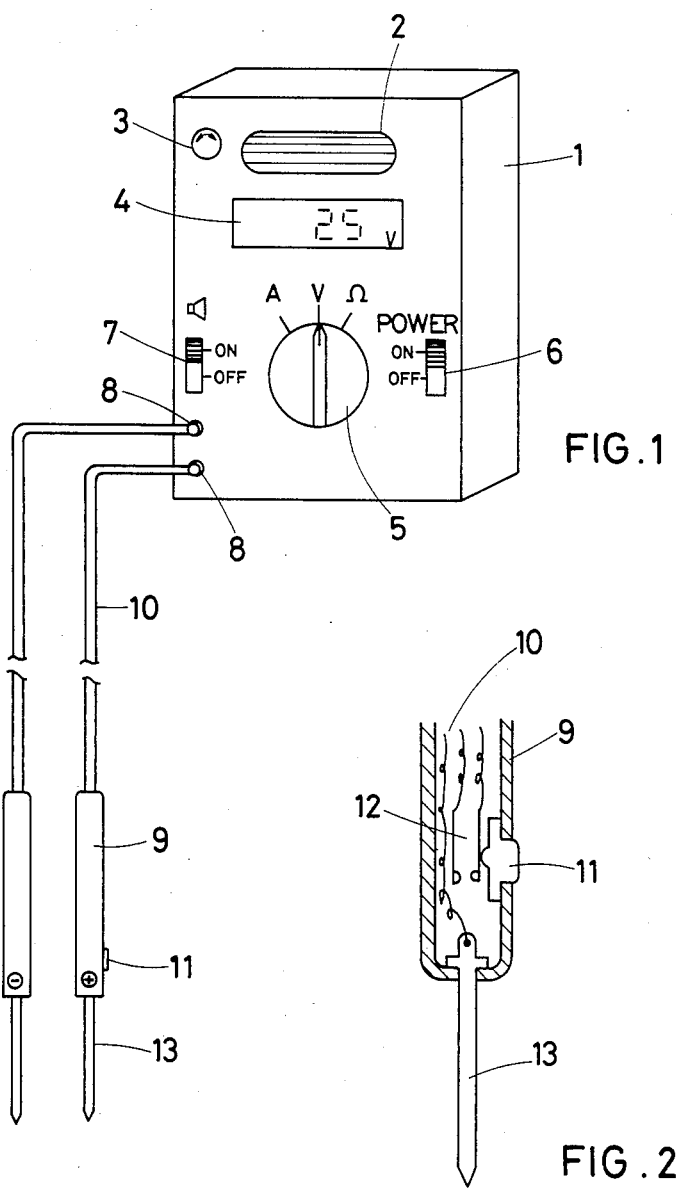

DIGITAL VOLT-OHM METER WITH AUDIBLE SYNTHESIS OF MEASURED VALUES

This application is a continuation of copending application Ser. No. 130,349, filed on Mar. 14, 1980, now abandoned.

BACKGROUND OF THE INVENTION

This invention relates to a measuring instrument, and more particularly to a new and useful audible output measuring instrument which provides an audible indication of the results of measurements.

While the following description will be set forth in a digital tester environment, it will be appreciated that the present invention is equally applicable to any other type of measuring instruments. In the case of the prior art pointer display type or digital display type tester, it is necessary for the operator to look at a display and thus keep his eyes away from an object being measured in order to learn the results of measurements after he has placed a detecting terminal leading from a tester rod into contact with the object. Especially when it is desired to measure voltage or resistance values, the operator faces problems in that the detecting terminal may move away from the object or come into contact with another terminal not associated with that measurement and the operator therefor risks inadvertant recognition of improper results of measurements.

OBJECTS AND SUMMARY OF THE INVENTION

Accordingly, it is an object of the present invention to provide a new and improved measuring instrument capable of providing audible indications of the results of measurements.

Another object is to provide a new and improved measuring instrument relying upon the recently developed speech synthesizer technology for providing audible voices indicative of the results of measurements, which may be implemented with a large scale integrated circuit (LSI) chip.

In accordance with the present invention a tester is disclosed with the ability of providing an audible indication of the results of measurements, thus enabling the operator to readily recognize readouts of measurements while keeping his eyes on an object being measured, thereby ensuring simple but accurate measurements. Moreover, when readouts are derived in the form of audible synthesized human voices, persons remote from the measuring point can dictate those readouts of measurements conveniently and quickly.

Significant advantages of the tester embodying the present invention are as follows:

(1) A tester rod is provided with a manually operable switch which enables the delivery of audible indications of measurements when actuated. Accurate readouts are consistently available in the form of audible voices upon actuation of the switch while a detecting terminal leading from the tester rod is kept tightly secured on the object being measured.

(2) The tester is adapted to provide not only an audible indication but also a visual indication of the results of measurements. Thus, even when the operator fails to listen to such audible indication, it is still possible for him to visually confirm readouts of measuments. (3) The tester can also be adapted to provide an audible warning signal to call the operator's attention prior to the delivery of audible indications of the results of measurements. In other words, an audible phrase of "measured value is" may be first announced and an audible indication of the readout of the measurement may follow (as a whole, "measured value is . . . ."). Provided that audible indications of measured values are delivered immediately after the completion of measurements, there would be a great possibility of his failure to listen to those indications. However, the tester of the present invention provides an audible warning phrase "measured value is" in advance of the delivery of audible indications so that the operator may be get ready to dictate the measured values when in a relatively absent-minded condition. In addition, whereas in the case of delivering only audible indications of measured values, the partition between those output values become vague, especially upon continued measurements. The tester embodying the present invention places the above mentioned audible phrase before or after audible indications of measuring readouts to make clear the partition between the two adjacent readouts.

(4) Unit information such as "volt", "ampere", "ohm", etc. is additionally provided in the form of synthesized voices for audible indications of measuring readouts to preclude error in the changeover of measuring modes.

(5) A mode selector switch is provided at the body of the tester for selection of an audible indication mode and a visual indication mode. During the audible indication mode readouts are displayed on a visual display while the detecting terminal from the tester rod is kept in contact with the object of interest, and the readouts are audibly displayed only upon closure of the manually operable switch. While in the visual indication mode, on the other hand, readouts of measurements are displayed on the visual display without any audible indication thereof only upon closure of the manually operable switch. With such an arrangement, when it is undesirable to indicate readouts in the form of audible voices, readouts can be provided in only a visual form. When the operator wants to confirm readouts derived upon closure of the switch, he is able to confirm either audibly or visually. In other words, audible indication is more desirable in learning only the readouts, while continued visual indication is more favorable when the readouts are to be written down on a slip of paper.

BRIEF DESCRIPTION OF THE DRAWINGS

The foregoing as well as other objects, features and advantages of the present invention will become more readily appreciated upon the consideration of the following detailed description of the illustrated embodiments, together with the accompanying drawings, wherein:

FIG. 1 is a perspective view showing the appearance of one preferred form of the present invention;

FIG. 2 is a cross sectional view of the inside structure of a tester rod in the preferred form shown in FIG. 1;

DETAILED DESCRIPTION OF THE ILLUSTRATED EMBODIMENT

Figure 3:
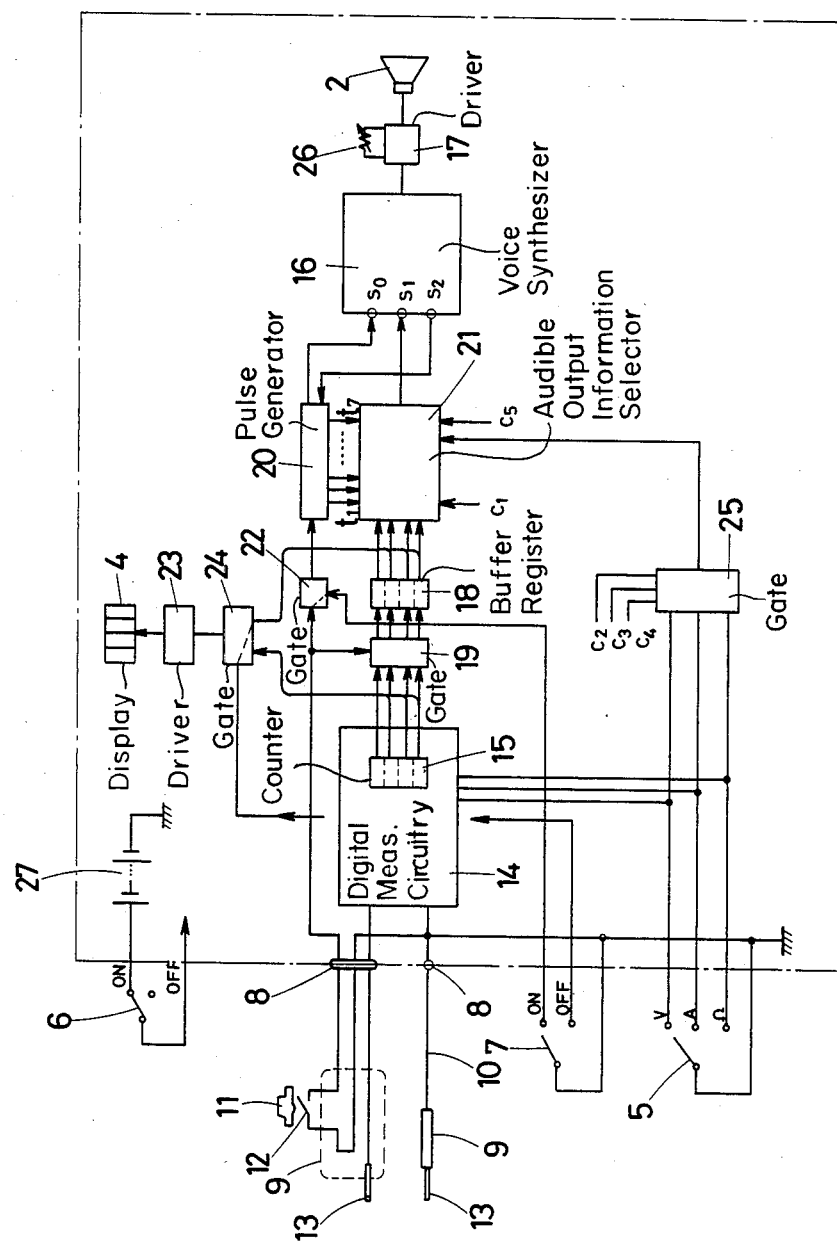
FIG. 3 is a schematic block diagram of the preferred form shown in FIG. 1.

Referring initially to FIGS. 1 and 2, a tester embodying the present invention is illustrated which includes a body 1, a loud speaker 2, a sound volume knob 3, a visual display 4 (typically, a liquid crystal display), a measuring mode selector 5, a power switch 6, an output mode selector switch 7 having an audible indication mode (ON) and a visual indication mode (OFF), a pair of input terminals 8, a pair of tester rods 9, lead wires 10, a measuring switch 11, a pair of contacts 12 in the switch 11 and a detecting terminal 13.

If the output mode changeover switch 7 is placed into the ON position (the audible indication mode) and the detecting terminal 13 is tightly attached to an object to be measured, then the illustrated tester delivers an audible message "measured value is . . . volts" during the voltage (V) measuring mode. Of course, other audible messages such as "measured value is . . . amperes" and "measured value is . . . ohms" are available during the current (I) measuring mode and the resistance ($\Omega$) measuring mode. These audible indications are delivered only upon closure of the measuring switch 11, whereas the readouts of measurements are visually displayed from time to time while the detecting terminal is held in contact with the object being measured.

On the other hand, if the output mode switch 7 is turned to the OFF position (visual indication mode) and the detecting terminal is in contact with the object, then the readouts are visually indicated on the display 4 only upon closure of the measuring switch 11. Even after the detecting terminal 13 is detached from the object, the display 4 remains on providing a visual display of those readouts without any audible indication thereof.

Figure 4:
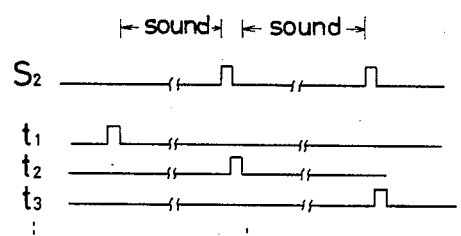
FIG. 4 is a waveform diagram showing signals developing within the preferred form of FIG. 1.

Turning to FIGS. 3 and 4, digital measuring circuitry 14 has the function of converting the readouts (analog values) from the detecting terminal 13 into corresponding digital values. A counter 15 is provided within the digital measuring circuitry 14 to count measured values and provide its count as the results of measurements. The counter 15 assumes a new count every sampling interval. Details of the digital measuring circuitry 14 are illustrated in FIG. 5 and FIG. 6 is a waveform diagram for explanation of operation of the digital measuring circuitry.

Figure 5:
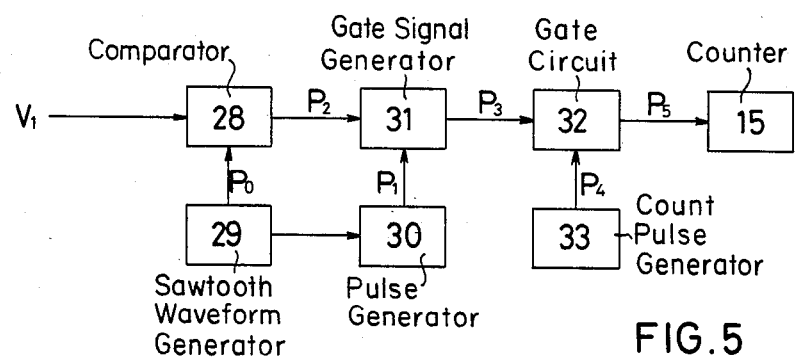
FIG. 5 is a detailed circuit diagram of digital measuring circuitry in the preferred form of FIG. 1.
Figure 6:
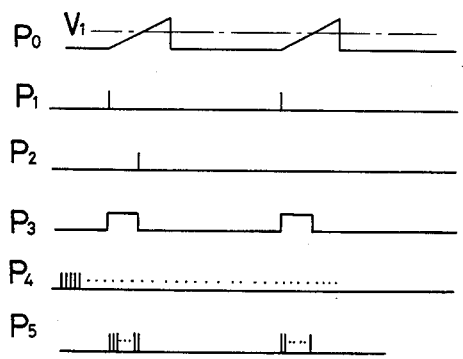
FIG. 6 is a waveform diagram for explanation of operation of the digital measuring circuitry of FIG. 5.

In FIG. 5, a comparator 28 compares an input voltage $V_1$ applied via the detecting terminal 13 from the object and the output $P_o$ of a saw-tooth waveform generator 29 and provides its output $P_2$ when the both agree in voltage level. A pulse generator 30 develops a pulse $P_1$ at the leading edge of the output $P_o$ of the saw-tooth waveform generator 29. A gate signal generator 31 develops a gate pulse $P_3$ which rises at the pulse $P_1$ from the pulse generator 30 and falls at the pulse $P_2$ from the comparator 28. A gate circuit 32 becomes operable upon receipt of the gate pulse $P_3$ from the gate signal generator 31 and gates count pulses $P_4$ from a count pulse generator 33 as an effective count pulse into a next succeeding counter 15 during the period of time where the gate pulses $P_3$ are developed. A counter 15 counts the count pulses $P_5$ derived from the gate circuit 32. When $P_o = V_1$ the results of the counting operation shows a digital measured value corresponding to the input value as they are. The input value is counted with the counter 15 each time the pulse $P_o$ is developed at a given interval.

Returning to FIGS. 3 and 4, voice synthesizer circuitry 16 accepts a signal $S_o$ which determines the length of time in which input data are loaded into the voice synthesizer circuitry 16, the above mentioned input data $S_1$ (data desired to be outputted in the form of audible sounds) and a signal $S_2$ indicating the completion of an audible message corresponding to the input data. A driver circuit 17 is provided for the loud speaker 2 and a variable resistor 26 is variable in resistance upon actuation of the volume knob 3.

A buffer register 18 (typically, a four-digit register for a four-digit display) temporarily stores the count (the contents of the counter 15) available from the digital measuring circuitry 14. A gate circuit 19 is provided for transmission of the contents of the counter 15 into the buffer register 18.

[AUDIBLE INDICATION MODE SELECTED BY THE OUTPUT MODE]

[SELECTOR SWITCH IN THE ON POSITION]

The detecting terminal 13 is forced into tight contact with the object and the measuring switch 11 is actuated such that the contacts 12 are closed and the gate circuit 19 is turned on. The contents of the counter 15 are unloaded into the buffer register 18. Accordingly, a sequential pulse generator 20 produces in sequence pulses $t_1, \ldots t_7$ and more particularly produces the first pulse $t_1$ upon actuation of the measuring switch 11 and closure of the contacts 12, thus initiating the first audible output routine. In response to an end signal $S_2$ with respect to the first audible output routine, the generator 20 produces the second pulse $t_2$. In this manner, the remaining pulses $t_4 \ldots t_7$ are produced each time the signal $S_2$ comes.

An audible output information selection circuit is labeled 21. A gate circuit 22 transfers a signal resulting from actuation of the switch 11 into the sequential pulse generator 20 which in turn is enabled to develop the pulses $t_1 \ldots t_7$, only when the output mode selector 7 is placed in the ON position.

A driver 23 is provided for the display 4. A gate circuit 24 permits the contents of the buffer register 18 and the contents of the counter 15 to enter the driver 23 when the output mode selector switch 7 is in the OFF position and the ON position, respectively. The contents shifted into the driver 23 are indicated on the display 4. Consequently, when the output mode selector switch 7 is in the ON position, the instantaneous measured values (the contents of the counter 15) as detected by use of the detecting terminal 13 are visually indicated on the display 4. When the output mode selector 7 is off, the measured values transferred into the buffer register 18 upon actuation of the measuring switch 11 appear on the visual display 4.

$C_1 \ldots C_5$ applied to the audible output information selection circuit 21 are binary codes corresponding to audible output information, as will be discussed below.

$C_1$ is the binary code directing the voice synthesizer circuitry 16 to deliver an audible message "sokuteichi wa" (English version is "measured value"). When this $C_1$ is applied to the $S_1$ input of the voice synthesizer circuit 16 via the audible output selector circuit 21, sound quantizing information relating to "sokuteichi wa" is fetched in succession from a sound quantizing information storage area in the circuitry 16 and fed into the speaker driver 17 via digital to analog conversion to deliver the audible message "sokuteichi wa."

$C_2$ is the binary code directing the voice synthesizer circuitry 16 to deliver an audible message "boruto" (its English version is "volts").

$C_3$ is the binary code directing the voice synthesizer circuitry 16 to deliver an audible message "anpea" (its English version is "amperes").

$C_4$ is the binary code directing the voice synthesizer circuitry 16 to deliver an audible message "ohmu" (its English version is "ohms").

$C_5$ is the binary code directing the voice synthesizer circuitry 16 to deliver a message "desu" (its English version is "is" and note that the location of verbs differs between Japanese and English expressions).

A gate circuit 25 supplies the corresponding one of the above defined binary codes $C_2$, $C_3$ and $C_4$ to the audible output information selection circuit 21, depending upon the operating state of the measuring mode selector switch 5.

When the contacts 12 are closed upon actuation of the measuring switch 11, the sequential pulse generator 20 produces the first pulse $t_1$ and the audible output information selection circuit 21 sends the binary codes $C_1$ to the voice synthesizer circuitry 16 to deliver the audible message "sokuteichi wa." Upon the delivery of such message the end signal $S_2$ is developed to produce the next pulse $t_2$. The pulses $t_2$ through $t_5$ are pulses that shift the contents of the buffer register 18 storing the readouts of measurements digit by digit in the descending order into the voice synthesizer circuitry 16. The most significant digit of the buffer register 18 is transferred into the voice synthesizer circuitry 16 in response to the pulse $t_2$, the second significant digit in response to $t_3$, the third significant digit in response to $t_4$ and the least significant digit in response to $t_5$.

By way of example, when it is desired to deliver an audible message indicative of 1234 Ω, two ways of announcement are possible one of annoucing "sen nihyaku sanjyu yon ohmu" (its English version is a thousand two hundred and thirty-four ohms") and the other of annoucing "ichi ni san yon ohmu" (its English version is "one two three four ohms"). The former method is more desirable for the operator's recognition.

The audible indication of the readouts of measurements is provided in the above described manner using the pulses $t_2$ to $t_5$. Upon the development of the pulse $t_6$ one of the codes $C_2$, $C_3$ and $C_4$ is fed into the voice synthesizer circuitry 16. For instance, when the measuring mode selector switch 5 is in the voltage (V) position, the codes $C_2$ are fed thereto to deliver the message "boruto." The end signal $S_2$ follows upon the completion of the message "boruto" to thereby produce the pulse $t_7$ which in turn sends the code $C_5$ to the voice synthesizer circuitry 16. The code $C_5$ instruct the synthesizer circuitry to deliver the message "desu". The generation of the sequential pulses come to a halt upon the completion of the pulse $t_7$.

With the above mentioned arrangement, when the readouts of voltage are 25 V, an audible message "sokuteichi wa nijyu go boruto desu" or "sokuteichi wa ni go boruto desu" is delivered.

Under the circumstances where the output mode switch 7 is on, the gate circuit 24 serves to transfer the contents of the counter 15 into the driver 23 so that the display 4 provides the instantaneous readout constantly.

Each time the respective pulses $t_1 \ldots t_7$ are developed the input signal $S_o$ is supplied such that the output of the audible output information selection circuit 21 is loaded into the voice synthesizer circuitry 16.

[VISUAL INDICATION MODE SELECTED BY THE OUTPUT MODE]

[SELECTOR SWITCH IN THE OFF POSITION]

If the output mode selector switch is turned off, then no signal is supplied to the sequential pulse generator 20 even upon actuation of the measuring switch 11. Nor does the voice synthesizer circuitry provides any sound quantizing information. However, by the action of the gate circuit 19 the contents of the counter 15 are transferred and temporarily stored within the buffer register 18 upon actuation of the measuring switch 11. This measured value is then fed into the driver 23 via the gate circuit 24 and visually indicated on the display 4 (the gate circuit 24 serves to transfer the contents of the buffer register 18 into the driver 23 when the output mode selector 7 is off). It will be appreciated that an audible output is prevented from being delivered when the output mode selector switch 7 is in the off position. The readouts are temporarily stored in the buffer register 18 and displayed on the visual display 4. In the drawings, a power battery is labeled 27.

Figure 7:
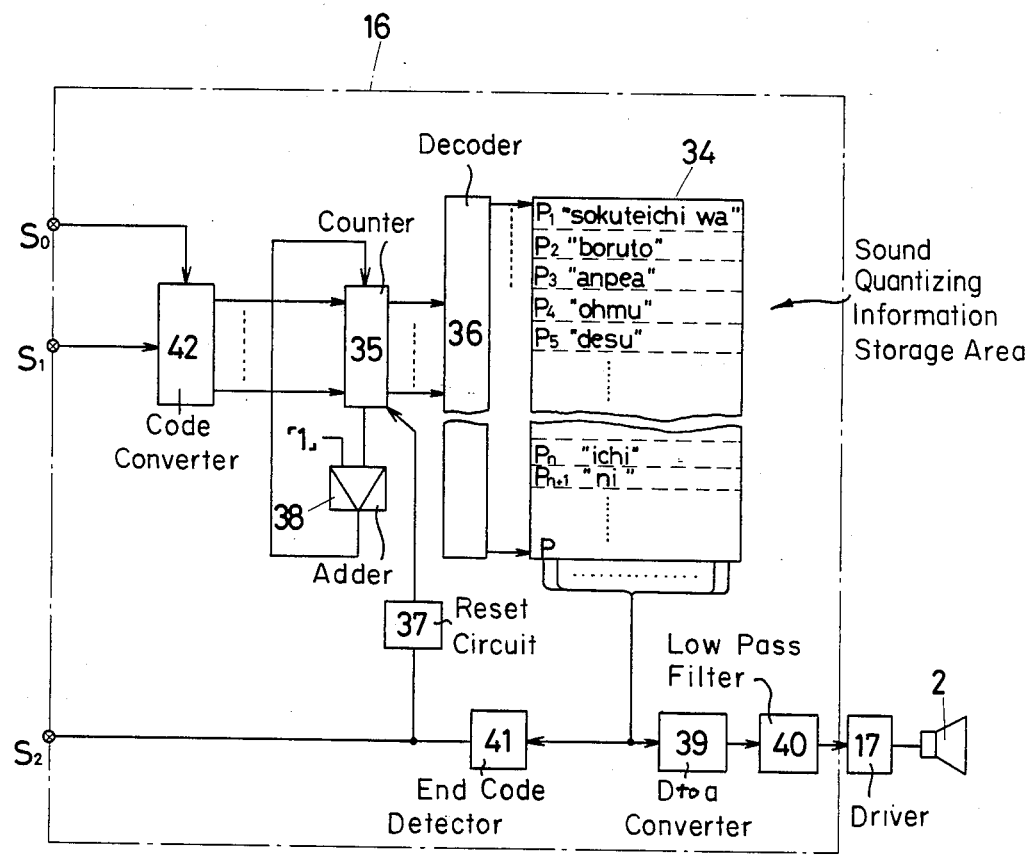
FIG. 7 details voice synthesizer circuitry in the preferred embodiment.

FIG. 7 shows details of the voice synthesizer circuitry 16 which includes the sound quantizing information storage area 34 made of a well known read only memory, for example, and designated $P_1$, $P_2$, ... $P_n$, $P_{n+1}$, ... Each of the storage areas consists of a first segment storing a plurality of pieces of the sound quantizing information representing one word in a stepwise manner and a second segment storing an end code at a step following the final step of the first segment. The sound quantizing information storage area 34 has its associated address counter 35 and address decoder 36. The address counter 35 is reset by use of a reset circuit 37 when no audible message is provided. With the address counter 35 in the reset state, the sound quantizing information storages areas 34 are neither addressed nor is any audible message provided. When it is desirable to provide audible indications of the readouts, an initial address of its associated sound area P is placed into the address counter 35. For instance, in the case where a desired word is contained in the area $P_2$, the initial address of the area $P_2$ is placed into the counter 35 so that the information is recalled from that initial address in the sound quantizing information storage area 34. An adder 38 increments the address counter 35 by one. When the address counter 35 is in the reset state, the adder 38 does not perform addition with no change in the contents of the counter 35. However, if the initial address is reached and ≠"0", the adder 38 then automatically perform addition of "1" at a given sampling frequency. Therefore, once the initial address has been set in the address counter 35, the address will be automatically incremented one by one. For this reason the sound quantizing information is fetched sequentially from the area $P_2$ of the sound quantizing information storage 34. This information is converted into analog signals through a digital to analog converter 39 and only a low frequency component thereof passes through a low-pass filter 40. It is desirable to filter the analog signals when they are of a stepwise form after the digital to analog conversion, due to the fact that failure to filter results in mixture of high frequency components and generation of harsh noise via the loud speaker. The output of the low-pass filter 40 is suppled to the speaker driver 17 to drive the loud speaker 2. As mentioned previously, the end code storing step is located at the end of the sound quantizing information storage areas. Accordingly, upon the completion of the audible indication of the desired word the storage 34 develops the end code which in turn is sensed by an end code detector 41 to render the reset circuit 37 operable to reset the address counter 35. None of the addresses of the storage 34 are designated to halt the delivery of an audible indication. This situation is kept on until a new initial address is placed into the address counter 35. A code converter 42 is adapted to determine the initial address of a desired one of the storage areas by use of a sound area specifying signal $S_1$ (the respective codes $C_1$ ... $C_5$ or numerical codes) in order to place that initial address into the address counter 35. The code converter 42 executes its conversion operation in response to the input signal $S_o$. The detection signal as detected by the end code detector 41 is supplied as the end signal $S_2$ to the sequential pulse generator 20.

In the above illustrated embodiment an earphone terminal may be provided instead of the provision of the loud speaker to deliver an audible indication of the readouts of measurements. In addition, the tester with audible output can be adapted to provide audible indications with respect to specific operating conditions of the tester such as an unstable condition, an overrange condition, a short-circuit condition and an open-circuit condition. A device for sensing those conditions may be constructed in a well known method.

The specific examples as herein shown and described are for illustrative purposes. Various changes will no doubt occur to those skilled in the art and will be understood as forming a part of the present invention insofar as they fall within the spirit and scope of the appended claims.

We claim:
1. A measuring instrument comprising:
   means for measuring and quantizing data to form a measured value signal;
   first digital semiconductor memory means for storing digital representation of words to be used in audibly reciting measured values;
   second digital semiconductor memory means for storing digital representations of units of measurements used in said measuring instrument;
   selection means responsive to said measured value signal for selecting areas within said first memory means corresponding to the digital representation of words to be used in audibly reciting said measured value and for selecting areas within said second memory means corresponding to the digital representations of words to be used in audibly reciting the units of measurement used;
   means for decoding said digital representations produced by said selection means to produce an analog audio synthesized speech signal;
   transducer means for converting said audio signal into an audible representation of said measured value and the corresponding units of measurement used; and
   means for providing an audible warning signal immediately before the delivery of the audible representation of said measured value.
2. A measuring instrument according to claim 1 further comprising means for providing an audible message indicative of a specific operating condition of said measuring instrument.
3. The instrument of claim 1 further comprising means responsive to said measured value signal for visually displaying said measured value.
4. The instrument of claims 1 to 3 wherein said data is physical quantity measurement data.
5. The instrument of claim 4 wherein said physical quantity is selected from the group consisting of voltage, current and resistance.
6. The instrument of claims 1 or 3 further comprising:
   measurement probe means for sensing said data, said probe means including a switch;
   said selection means being enabled only upon actuation of said switch.
7. The instrument of claim 6 wherein said means for visual displaying is enabled only when said probe means is positioned for measurement of said data.
8. The instrument of claim 7 further comprising mode selection means for selecting between an audible indication mode wherein said selection means is enabled upon actuation of said switch and a visual indication mode wherein said selection means is disabled and said means for visually displaying is enabled only upon actuation of said switch.

* * * * *